(12) United States Patent
Namkung et al.

(10) Patent No.: US 10,668,687 B2
(45) Date of Patent: Jun. 2, 2020

(54) PROTECTION TAPE FOR PRINTED CIRCUIT BOARD AND DISPLAY DEVICE INCLUDING THE SAME

(71) Applicant: SAMSUNG DISPLAY CO., LTD., Yongin-si, Gyeonggi-do (KR)

(72) Inventors: Jun Namkung, Yongin-si (KR); Sujin Jung, Yongin-si (KR); Hyunkyu Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 116 days.

(21) Appl. No.: 15/278,168

(22) Filed: Sep. 28, 2016

(65) Prior Publication Data
US 2017/0303406 A1    Oct. 19, 2017

(30) Foreign Application Priority Data

Apr. 19, 2016 (KR) .................. 10-2016-0047562

(51) Int. Cl.
*B32B 3/00* (2006.01)
*B32B 3/30* (2006.01)
(Continued)

(52) U.S. Cl.
CPC .............. *B32B 3/30* (2013.01); *B32B 3/263* (2013.01); *B32B 7/12* (2013.01); *B32B 15/08* (2013.01); *B32B 15/09* (2013.01); *B32B 15/20* (2013.01); *B32B 27/06* (2013.01); *B32B 27/281* (2013.01); *B32B 27/36* (2013.01); *H05K 3/281* (2013.01); *B32B 2250/03* (2013.01);
(Continued)

(58) Field of Classification Search
CPC ....... B32B 7/12; B32B 3/30; B32B 2307/202; B32B 2307/206; B32B 2457/08; B32B 2457/20; H05K 2201/0129; H05K 2201/0195; H05K 2201/0191; H05K 3/281; H05K 3/285; H05K 3/387; H05K 2201/0145; H05K 2201/0154; H05K 2203/0557
See application file for complete search history.

(56) References Cited

U.S. PATENT DOCUMENTS 3,565,247 A * 2/1971 Brochman ............. B65D 65/38
428/40.2
5,459,335 A * 10/1995 Matsushita ......... H01L 21/2007
257/506
(Continued)

FOREIGN PATENT DOCUMENTS

JP   2013-229505 A   11/2013
KR   10-2012-0076968 A   7/2012
(Continued)

*Primary Examiner* — Steven T Sawyer
(74) *Attorney, Agent, or Firm* — Kile Park Reed & Houtteman PLLC

(57) ABSTRACT

A protection tape for a printed circuit board (PCB) includes an insulating base plate, a conductive layer over the insulating base plate, and an adhesive layer over the conductive layer, the adhesive layer including a main part having a first thickness and a subsidiary part having a second thickness less than the first thickness, the main part corresponding to at least a center portion of the insulating base plate and the subsidiary part being arranged at an outside of the main part.

22 Claims, 9 Drawing Sheets

(51) Int. Cl.
    *B32B 7/12*      (2006.01)
    *H05K 3/28*      (2006.01)
    *B32B 27/06*     (2006.01)
    *B32B 15/08*     (2006.01)
    *B32B 27/28*     (2006.01)
    *B32B 15/20*     (2006.01)
    *B32B 3/26*      (2006.01)
    *B32B 15/09*     (2006.01)
    *B32B 27/36*     (2006.01)
    *H05K 3/38*      (2006.01)

(52) U.S. Cl.
    CPC ... *B32B 2307/202* (2013.01); *B32B 2307/206* (2013.01); *B32B 2307/51* (2013.01); *B32B 2405/00* (2013.01); *B32B 2457/08* (2013.01); *B32B 2457/10* (2013.01); *B32B 2457/20* (2013.01); *B32B 2571/00* (2013.01); *H05K 3/285* (2013.01); *H05K 3/387* (2013.01); *H05K 2201/0129* (2013.01); *H05K 2201/0145* (2013.01); *H05K 2201/0154* (2013.01); *H05K 2201/0191* (2013.01); *H05K 2201/0195* (2013.01); *H05K 2203/0557* (2013.01)

(56) References Cited

U.S. PATENT DOCUMENTS

| | | | |
|---|---|---|---|
| 6,475,314 B1* | 11/2002 | Yoshihiro | B32B 7/14 428/41.8 |
| 9,991,467 B2 | 6/2018 | Namkung et al. | |
| 2009/0038839 A1* | 2/2009 | Hashimoto | H05K 1/0218 174/350 |
| 2011/0050558 A1* | 3/2011 | Park | G02F 1/133603 345/102 |
| 2012/0009399 A1* | 1/2012 | Nonaka | B32B 7/10 428/214 |
| 2012/0244912 A1* | 9/2012 | Hiwatashi | H04M 1/026 455/566 |
| 2013/0224436 A1* | 8/2013 | Kim | C09J 4/00 428/141 |
| 2014/0151092 A1* | 6/2014 | Ho | H05K 1/0274 174/251 |
| 2015/0334886 A1* | 11/2015 | Jang | B32B 7/06 428/201 |

FOREIGN PATENT DOCUMENTS

| | | |
|---|---|---|
| KR | 10-2012-0100412 A | 9/2012 |
| KR | 10-1506275 B1 | 3/2015 |

\* cited by examiner

PROTECTION TAPE FOR PRINTED CIRCUIT BOARD AND DISPLAY DEVICE INCLUDING THE SAME

CROSS-REFERENCE TO RELATED APPLICATION

Korean Patent Application No. 10-2016-0047562, filed on Apr. 19, 2016, in the Korean Intellectual Property Office, and entitled: "Protection Tape for Printed Circuit Board and Display Device Including the Same," is incorporated by reference herein in its entirety.

BACKGROUND

1. Field

One or more embodiments relate to a protection tape for a printed circuit board (PCB).

2. Description of the Related Art

A display device generally includes a display panel and a PCB electrically connected to the display panel. Wirings that transfer an electrical signal to be applied to the display panel are formed in the PCB.

The display device may include a frame, various electronic devices such as battery, etc., in addition to the display panel and the PCB electrically connected to the display panel.

SUMMARY

Embodiments are directed to a protection tape for a printed circuit board (PCB) including an insulating base plate, a conductive layer over the insulating base plate, and an adhesive layer over the conductive layer, the adhesive layer including a main part having a first thickness and a subsidiary part having a second thickness less than the first thickness, the main part corresponding to at least a center portion of the insulating base plate and the subsidiary part being arranged at an outside of the main part.

The subsidiary part may be positioned outside the main part and may surround the main part.

The subsidiary part may include a first subsidiary part positioned at one side of the main part and a second subsidiary part positioned at another side of the main part, the first subsidiary part and the second subsidiary part being spaced apart from the main part.

The main part may include a groove in an upper surface of the main part, the groove extending in a direction between the second subsidiary part and the first subsidiary part, or the main part may include an opening in the upper surface of the main part in an upper surface of the main part, the opening extending in the direction between the second subsidiary part and the first subsidiary part in an upper surface of the main part.

The groove or opening may extend from an end of the main part next to the first subsidiary part to an end of the main part next to the second subsidiary part.

The main part may include a groove extending in a direction from the first subsidiary part to the second subsidiary part in an upper surface of the main part. A height from an upper surface of the conductive layer in a direction toward the adhesive layer to a lower surface in the groove may be less than a height from the upper surface of the conductive layer to an upper surface of the first subsidiary part.

An edge end surface of the insulating base plate may be flush with an edge end surface of the conductive layer. The subsidiary part may be located over the conductive layer such that an upper surface of the conductive layer around at least one edge of the conductive layer is exposed.

The main part of the adhesive layer may include a plurality of grooves extending from an end of the main part adjacent to the first subsidiary part to an opposite end of the main part adjacent to the second subsidiary part, the grooves being configured such that when the adhesive layer is pressed to the PCB in an attachment direction from the first subsidiary part toward the second subsidiary part, air that is present between the protection tape and the PCB is discharged to an outside through the grooves and through a space between the main part and the second subsidiary part.

An edge end surface of the insulating base plate may be flush with an edge end surface of the conductive layer, The subsidiary part may be located over the conductive layer such that an upper surface of the conductive layer around at least one edge of the conductive layer is exposed.

The conductive layer may be positioned over the insulating base plate so as to expose an upper surface of the insulating base plate around at least one edge of the insulating base plate.

The conductive layer may include a center part having a third thickness, and an edge part having a fourth thickness greater than the third thickness, the center part of the conductive layer corresponding to the main part of the adhesive layer and the edge part corresponding to the subsidiary part of the adhesive layer.

A distance from an upper surface of the insulating base plate to an upper surface of the main part of the adhesive layer may be the same as a distance from the upper surface of the insulating base plate to an upper surface of the subsidiary part of the adhesive layer.

An upper surface of a portion of the conductive layer corresponding to the subsidiary part may include a plurality of grooves. The subsidiary part may fill the plurality of grooves.

The main part and the subsidiary part may be spaced apart from each other.

The subsidiary part may include a conductive material.

A modulus of the subsidiary part may be greater than a modulus of the main part.

Each of the main part and the subsidiary part may include oligomers and monomers. A ratio of the monomers to oligomers in the subsidiary part may be higher than a ratio of the monomers to oligomers in the main part.

Embodiments are also directed to a display device including a display panel, a printed circuit board (PCB) electrically connected to the display panel, and the protection tape for the PCB as described above covering one surface of the PCB.

The display panel may include an upper surface and a lower surface. The PCB may include an upper surface and a lower surface. The display panel or the PCB may be bent such that the lower surface of the display panel and the lower surface of the PCB face each other. The protection tape for the PCB may cover the upper surface of the PCB.

A main part and a subsidiary part of the adhesive layer may be spaced apart from each other.

The subsidiary part of the adhesive layer may include a conductive material. The PCB may include a ground part electrically connected to the subsidiary part.

A modulus of the subsidiary part may be greater than a modulus of the main part.

Each of a main part and a subsidiary part of the adhesive layer may include oligomers and monomers. A ratio of the a ratio of the monomers to oligomers in the subsidiary part may be higher than a ratio of the monomers to oligomers in the main part.

Embodiments are also directed to a display device including a display panel, a printed circuit board (PCB) electrically connected to the display panel, and a protection tape for a PCB covering one surface of the PCB. The protection tape for the PCB may include an insulating base plate, a conductive layer over the insulating base plate, and an adhesive layer over the conductive layer, the adhesive layer being directly attached to the PCB such that an interface between the adhesive layer and the PCB is essentially free of air bubbles.

The adhesive layer may include a main part corresponding to at least a center portion of the insulating base plate and a subsidiary part spaced apart from the main part to correspond to at least one edge of the insulating base plate, the subsidiary part having a thickness less than a thickness of the center portion of the main part.

The adhesive layer may not extend beyond a boundary of the PCB.

The display device further may include at least one electronic device attached to an opposite surface of the protection tape from the PCB.

The at least one electronic device may include a battery or a camera.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
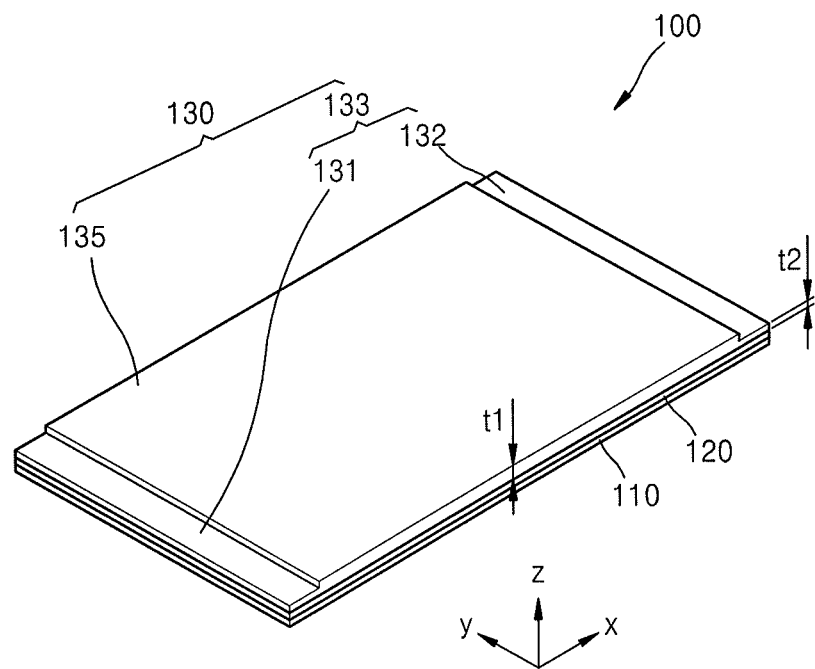
FIG. 1 illustrates a schematic perspective view of a protection tape for a printed circuit board (PCB), according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 illustrates a schematic perspective view of a protection tape 100 for a printed circuit board (PCB), according to an embodiment. As shown in FIG. 1, the protection tape 100 may include a base plate 110, a conductive layer 120, and an adhesive layer 130.

The base plate 110 may define an overall shape of the protection tape 100. The base plate 110 may include an insulating material such as, for example, polyethylene terephthalate (PET), polyimide (PI), etc.

The conductive layer 120 may be positioned on an upper surface of the base plate 110 (+z direction). The conductive layer 120 may include a conductive material such as copper, and, as shown in FIG. 1, may cover an entire surface of the base plate 110.

The adhesive layer 130 may be positioned over the conductive layer 120 and may include a main part 135 and a subsidiary part 133. The main part 135 may correspond to at least a center portion of the base plate 110. The subsidiary part 133 may be positioned outside the main part 135. For example, in FIG. 1, the subsidiary part 133 includes a first subsidiary part 131 positioned at one side of the main part 135 (−x direction) and a second subsidiary part 132 positioned at another side of the main part 135 (+x direction) and spaced apart from the first subsidiary part 131. A second thickness t2 that is a thickness of the subsidiary part 133 may be smaller than a first thickness t1 that is a thickness of the main part 135. The adhesive layer 130 may an adhesive layer material such as, for example, a pressure sensitive adhesive (PSA).

Figure 2:
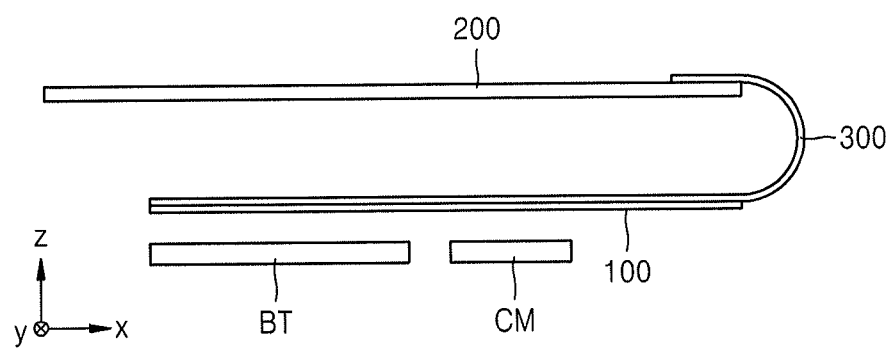
FIG. 2 illustrates a schematic lateral view of a display device including the protection tape for the PCB of FIG. 1, according to an embodiment.

The protection tape 100 for the PCB according to the present embodiment may be a component of a display device as shown in FIG. 2. FIG. 2 illustrates a schematic lateral view of the display device, according to an embodiment. When the display device includes a display panel 200 and a PCB 300 electrically connected to the display panel 200, the protection tape 100 as shown in FIG. 1 may cover one surface of the PCB 300 as a component of the display device.

The display panel 200 may have an upper surface and a lower surface. The PCB 300 also may have an upper surface and a lower surface. As shown in FIG. 2, the PCB 300 may be bent such that the lower surface of the display panel 200 and the lower surface of the PCB 300 face each other. Herein, the term "upper surface" is used refer to an outward-facing surface of the PCB 300. Accordingly, when the PCB 300 is bent such that the lower surface of the display panel 200 and the lower surface of the PCB 300 face each other inwardly, the outward-facing surface will continue to be referred to as the upper surface, even though it may face downward as illustrated in FIG. 2. The protection tape 100 may cover the upper surface of the PCB 300. As illustrated in FIG. 2, the protection tape 100 may cover only a part of the upper surface of the PCB 300. In some implementations, the protection tape 100 may entirely cover the upper surface of the PCB 300.

Figure 3:
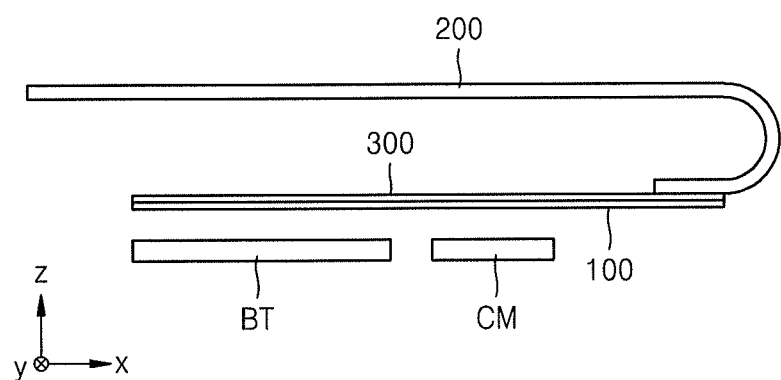
FIG. 3 illustrates a schematic lateral view of a display device, according to an embodiment.

FIG. 3 illustrates a schematic lateral view of a display device according to another embodiment. As illustrated in FIG. 3, the PCB 300 may not be bent but instead, a part of the display panel 200 may be bent. In this case, a substrate included in the display panel 200 may include various materials having a flexible or bendable characteristic, for example, a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

When the display panel 200 is bent, the lower surface of the PCB 300 may face the lower surface of the display panel 200. In this case, the protection tape 100 for the PCB may cover the entire upper surface of the PCB 300. Although the protection tape 100 covers an entire surface of the upper surface of the PCB 300 as shown in FIG. 3, or, in some implementations, may cover only a part of the upper surface of the PCB 300.

As shown in FIGS. 2 and 3, the display device may include various components in addition to the display panel 200, the PCB 300, and the protection tape 100. For example, the display device may include a frame, and/or various electronic devices such as a battery BT, a camera module CM, etc. In the display device, it is desirable that the display surface of the display panel 200 be visible to a user. Thus various electronic devices and the frame may be positioned at the rear side of the display panel 200 (−z direction), for example, in the rear side of the display panel 200 and the PCB 300 (−z direction).

In a general display device, there is a possibility that wirings formed in a PCB could contact other electronic devices and/or a frame, etc. during a manufacturing process or while the display device is in use after the display device is completely manufactured. Such contact could cause conductive wirings formed in the PCB to become electrically connected to such other electronic devices unexpectedly or could cause a short circuit to occur between the conductive wirings formed in the PCB due and such other electronic devices or a frame, etc.

However, in the display device according to the present embodiment, the protection tape 100 covers the upper surface of the PCB 300. Accordingly, conductive wirings of the PCB 300 may be covered by the protection tape 100, thereby effectively preventing the conductive wirings from contacting various electronic devices such as the battery BT, the camera module CM, etc and the frame that are positioned in the rear side of the display panel 200 and the PCB 300 (−z direction) A defect may be prevented from occurring in a manufacturing process or while in use after the display device is completely manufactured. In addition, when the protection tape 100 includes the conductive layer 120, the conductive layer 120 may act as a shield layer that prevents a wiring over the PCB 300 from being affected by external electromagnetic waves.

As described above, the second thickness t2, which is a thickness of the subsidiary part 133 of the adhesive layer 130, may be less than the first thickness t1, which is a thickness of the main part 135 thereof. The main part 135 may correspond to at least a center portion of the base plate 110. The subsidiary part 133 may be positioned outside the main part 135. Thus, the first thickness t1, which is a thickness of the center portion of the adhesive layer 130, may be understood as being greater than the second thickness t2, that is a thickness at one edge of the protection tape 100.

The protection tape 100 may be attached to the PCB 300 as shown in FIGS. 2 and 3. If the adhesive layer 300 included in the protection tape 100 were to have a uniform thickness in a entire area of the conductive layer 120, the adhesive layer 130 might not be present only between the protection tape 100 and the PCB 300, but a portion of the adhesive layer 130 could move outside an area of the PCB 300 during a process of attaching the protection tape 100 to the PCB 300. If a portion of the adhesive layer 130 were to move outside of the area of the PCB 300, the portion of the adhesive layer 130 could become unintentionally adhered to an electronic device that is another component of the display device. Accordingly, a malfunction of the other electronic device, etc. could occur. For example, if at least a part of the adhesive layer 130 has conductivity, the conductive part of the adhesive layer 130 could move outside the area of the PCB 300 and could adhere to the other electronic device, which could cause a defect such as a short circuit, etc.

However, in the display device according to the present embodiment, the second thickness t2, which is a thickness of the subsidiary part 133 of the adhesive layer 130, may be less than the first thickness t1, which is a thickness of the main part 135 of the protection layer 100. The main part 135 may correspond in location and area to at least a center portion of the base plate 110. The subsidiary part 133 may be positioned outside of the main part 135. The thickness of the adhesive layer 130 is related to an amount of adhesive layer material positioned over the conductive layer 120 per unit area of the conductive layer 120. It may be understood that as the thickness of the adhesive layer 130 is reduced, the amount of the adhesive layer material positioned over the conductive layer 120 per unit area of the conductive layer 120 is also reduced. Therefore, in the protection tape 100 included in the display device according to the present embodiment, the adhesive layer 130 may have a greater thickness at an approximate center portion of the conductive layer 120 and a smaller thickness at an approximate edge thereof. It may be understood that an amount of the adhesive layer material per unit area may be smaller at the approximate edge of the conductive layer 120 than at the approximate center portion thereof in relation to the conductive layer 120. Accordingly, the display device according to the present embodiment may dramatically reduce a possibility of a defect being caused due to portion of the adhesive layer 130 moving outside the area of PCB 300 during the process of attaching the protection tape 100 to the PCB 300.

As shown in FIG. 1, the subsidiary part 133 having the second thickness t2 less than the first thickness t1 of the main part 135 may include the first subsidiary part 131 positioned in one side of the main part 135 (−x direction) and the second subsidiary part 132 positioned in another side of the main part 135 (+x direction). The adhesive layer 130 may have a lesser thickness around a first edge of the conductive layer 120 extending from the −x direction to a y axis direction and a second edge thereof extending from the +x direction to the y axis direction. In some implementations, the adhesive layer 130 may have a greater thickness for the most part around a third edge of the conductive layer 120 extending from the +y direction to an x axis direction and a fourth edge thereof extending from the −y direction to the x axis direction in FIG. 1 according to a direction in which the protection tape 100 is attached to the PCB 300.

When the protection tape 100 is attached to the PCB 300, all parts of the facing surface of the protection tape 100 may not be attached to the facing surface of the PCB 300 at exactly the same time. For example, a vicinity of an edge of the protection tape 100 that is an −x axis direction edge extending in the y axis direction, i.e., the edge of the first subsidiary part 131 of the adhesive layer 130 and/or a vicinity thereof, may contact a corresponding part of the PCB 300 first. An area of the adhesive layer 130 contacting the PCB 300 may gradually increase, and a vicinity of an edge of the adhesive layer 130 that is a +x axis direction edge extending in the y axis direction, i.e., the edge of the second subsidiary part 132 of the adhesive layer 130, may then contact a corresponding part of the PCB 300.

During the process of attaching the protection tape 100 to the PCB 300 as described above, the base plate 110 of the protection tape 100 may be pressed. Pressing the protection tape 100 may start from the first subsidiary part 131 of the adhesive layer 130 and may progress toward the second subsidiary part 132 via the main part 135. In this regard, a possibility that the adhesive layer 130 moves outside the area of the PCB 300 may relatively increase in a first pressing part and a final pressing part during the process of attaching the protection tape 100 to the PCB 300. However, when the adhesive layer 130 has the first subsidiary part 131 and the second subsidiary part 132, which have a lesser thicknesses in the first pressing part and the final pressing part, movement of the adhesive layer 130 outside of the area of the PCB 300 during the process of attaching the protection tape 100 to the PCB 300 may be effectively hindered or prevented. The display device according to the present embodiment may also ensure secure attachment between the protection tape 100 and the PCB 300 through the main part 135, which has a greater thickness than the first subsidiary part 131 and the second subsidiary part 132. In some implementations, the subsidiary part 133 may surround the main part 135.

Although the adhesive layer 130 remains in a state as shown in FIG. 1 before attaching the protection tape 100 to the PCB 300, the adhesive layer 130 may have a different shape from that shown in FIG. 1 when pressure is applied to the protection tape 100 and/or the PCB 300, for example, when the protection tape 100 is attached to the PCB 300. The adhesive layer 130 may have elasticity, for example, while the protection tape 100 is attached to the PCB 300. Accordingly, the thickness of the adhesive layer 130 may be approximately uniform in most areas of the protection tape 100. In this case, amount of internal stress in the main part 135 of the adhesive layer 130 may be greater than the amount of internal stress in the subsidiary part 133 thereof due to an amount of the adhesive layer material per unit area being greater in the main part 135 than in the subsidiary part 133 in relation to the conductive layer 120.

As described above, the display device according to an embodiment may include the display panel 200, the PCB 300 electrically connected to the display panel 200, and the protection tape 100 covering one surface of the PCB 300. The protection tape 100 may include the insulating base plate 110, the conductive layer 120 located over the base plate 110, and the adhesive layer 130 located over the conductive layer 120. An internal stress at a center portion of the base plate 110 may be than internal stress at an edge of the base plate 110.

Figure 4:
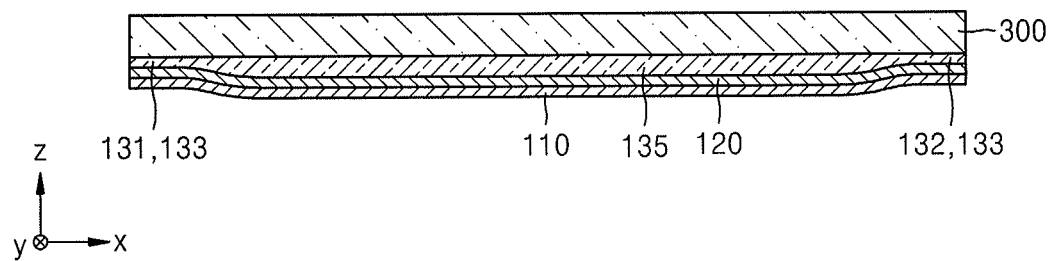
FIG. 4 illustrates a schematic cross-sectional view of a part of a display device, according to an embodiment.

Even if the adhesive layer 130 continuously contacts the PCB 300 due to a deformed shape of the adhesive layer 130, the thickness of the adhesive layer 130 may vary according to a position of the adhesive layer 130. For example, a thickness of the center portion of the main part 135 of the adhesive layer 130 may be greater than the thickness of the subsidiary part 133 thereof. FIG. 4 illustrates a schematic cross-sectional view of a part of a display device, according to another embodiment. As shown in FIG. 4, the display device may include the protection tape 100 The protection tape 100 continuously contacts the conductive layer 120 and the adhesive layer 130 having a thickness greater in a center portion of the base plate 110 than in one edge of the base plate 110.

A modulus of the subsidiary part 133 may be higher than the modulus of the main part 135 in order to prevent a part of the first subsidiary part 131 or the second subsidiary part 132 of the adhesive layer 130 from moving outside the area of the PCB 300 during a process of attaching the protection tape 100 to the PCB 300. A relatively high modulus may refer to a relative greater hardness. As a result, when the protection tape 100 is attached to the PCB 300, it may be possible to minimize or prevent the subsidiary part 133 having a high modulus from being moved outside the area of the PCB 300.

Various techniques may be used to adjust modulus. For example, if a material including oligomers and monomers is used to form the adhesive layer 130, the modulus may be adjusted by adjusting a ratio of monomers to oligomers. If the ratio of monomers to oligomers increases in a mixture of oligomers and monomers, the average chain length of a material of the adhesive layer 130 becomes shorter, and the modulus may increase. If the ratio of monomers to oligomers is reduced in the mixture of oligomers and monomers, the average chain length of the material of the adhesive layer 130 becomes longer, the modulus may be reduced. Thus, each of the main part 135 and the subsidiary part 133 of the protection tape 100 may include oligomers and monomers, and a ratio of monomers to oligomers in the main part 135 may be higher than a ratio of monomers to oligomers in the subsidiary part 133. Thus, the modulus of the subsidiary part 133 may be higher than the modulus of the main part 135.

The protection tape 100 for the PCB and the display device including the protection tape 100 are described above. The present disclosure is not limited to only the protection tape 100 for the PCB or the display device including the protection tape 100 for the PCB. Both the protection tape 100 for the PCB and the display device including the protection tape 100 belong to the scope of the disclosure. This may apply to embodiments that will be described later and modifications thereof. Embodiments regarding the protection tape 100 for the PCB will be described below for convenience of description.

Figure 5:
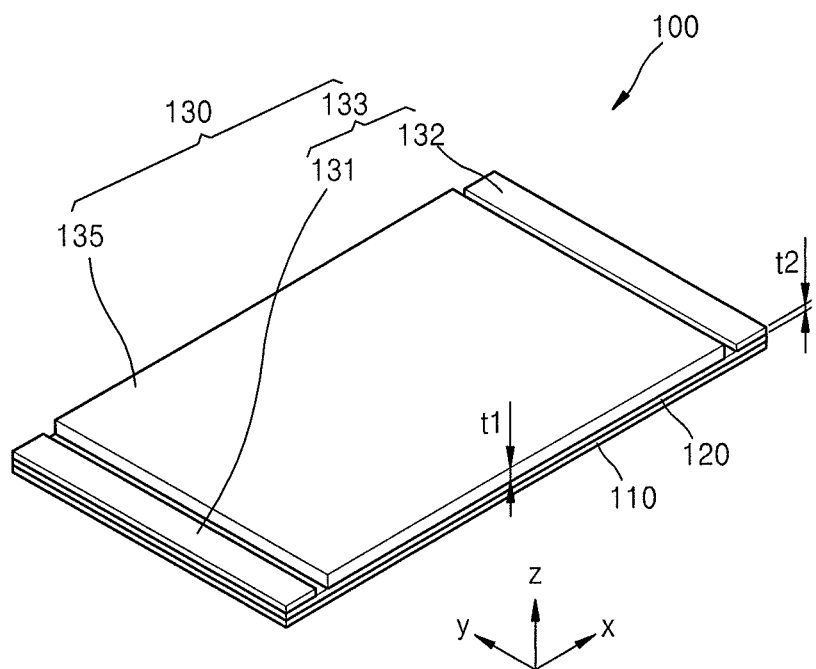
FIG. 5 illustrates a schematic perspective view of a protection tape for a PCB, according to an embodiment.

As shown in FIG. 1, the main part 135 and the subsidiary part 133 of the adhesive layer 130 may be integrally formed. FIG. 5 illustrates a schematic perspective view of the protection tape 100 for the PCB according to another embodiment. As shown in FIG. 5, the main part 135 and the subsidiary part 133 of the adhesive layer 130 may be spaced apart from each other.

A shape of the adhesive layer 130 may be deformed if pressure is applied to the protection tape 100 and/or the PCB 300 when the protection tape 100 is attached to the PCB 300, as described above. When the adhesive layer 130 includes the subsidiary part 133 having the lesser second thickness t2 and the main part 135 having the greater first thickness t1, as described above, an amount of the adhesive layer material per unit area may be greater in the main part 135 than in the subsidiary part 133 in relation to the conductive layer 120. An empty space may be obtained by spacing the main part 135 and the subsidiary part 133 apart from each other. Accordingly, movement of adhesive layer material from the main part 135 to outside the are of the PCB 300 may be hindered or prevented. Instead, such adhesive layer material may move into the empty space between the main part 135 and the subsidiary part 133 even if a shape of the main part 135 of the adhesive layer becomes deformed when the protection tape 100 is attached to the PCB 300.

Although the adhesive layer 130 remains in a state as shown in FIG. 5 before attaching the protection tape 100 to the PCB 300, the adhesive layer 130 may have a different shape from that shown in FIG. 5 if pressure is applied to the protection tape 100 and/or the PCB 300 when the protection tape 100 is attached to the PCB 300. In particular, an amount of internal stress in the main part 135 of the adhesive layer 130 may be greater than an amount of internal stress in the subsidiary part 133 thereof, due to an amount of the adhesive layer material per unit area being greater in the main part 135 than in the subsidiary part 133 in relation to the conductive layer 120.

As described above, the display device according to an embodiment may include the display panel 200, the PCB 300 electrically connected to the display panel 200, and the protection tape 100 for the PCB covering one surface of the PCB 300. The protection tape 100 for the PCB may include the insulating base plate 110, the conductive layer 120 arranged over the base plate 110, and the adhesive layer 130 arranged over the conductive layer 120. The adhesive layer 130 may include the main part 135 corresponding to at least a center portion of the base plate 110 and the subsidiary part 133 spaced apart from the main part 135 to correspond to at least one edge of the base plate 110 and having less internal stress than the main part 135.

Figure 6:
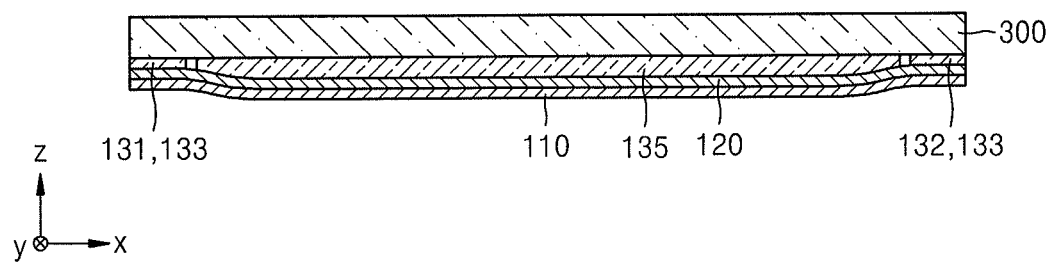
FIG. 6 illustrates a schematic cross-sectional view of a part of a display device, according to an embodiment.

Even if the protection tape 100 is attached to the PCB 300 due to a deformed shape of the adhesive layer 130, a thickness of the adhesive layer 130 may be different according to a position of the adhesive layer 130. For example, a thickness of a center portion of the main part 135 of the adhesive layer 130 may be greater than the thickness of the subsidiary part 133 thereof. FIG. 6 illustrates a schematic cross-sectional view of a part of a display device, according to another embodiment. As shown in FIG. 6, the adhesive layer 130 of the protection tape 100 for the PCB may include the main part 135 corresponding to at least a center portion of the base plate 110 and the subsidiary part 133 spaced apart from the main part 135 to correspond to at least one edge of the base plate 110 and having a thickness smaller than the thickness of the center portion of the main part 135.

Figure 7:
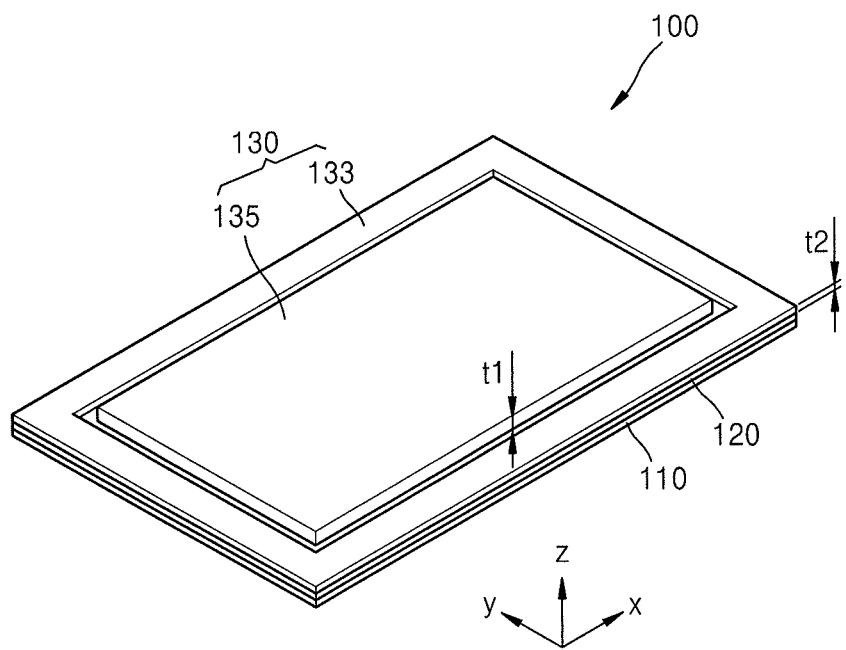
FIG. 7 illustrates a schematic perspective view of a protection tape for a PCB, according to an embodiment.

As shown in FIG. 5, the first subsidiary part 131 may be positioned at one side of the main part 135 (−x direction) and the second subsidiary part 132 may be positioned at another side of the main part 135 (+x direction). FIG. 7 illustrates a schematic perspective view of the protection tape 100 for the PCB according to another embodiment. According to FIG. 7, the subsidiary part 133 may surround the main part 135.

Figure 8:
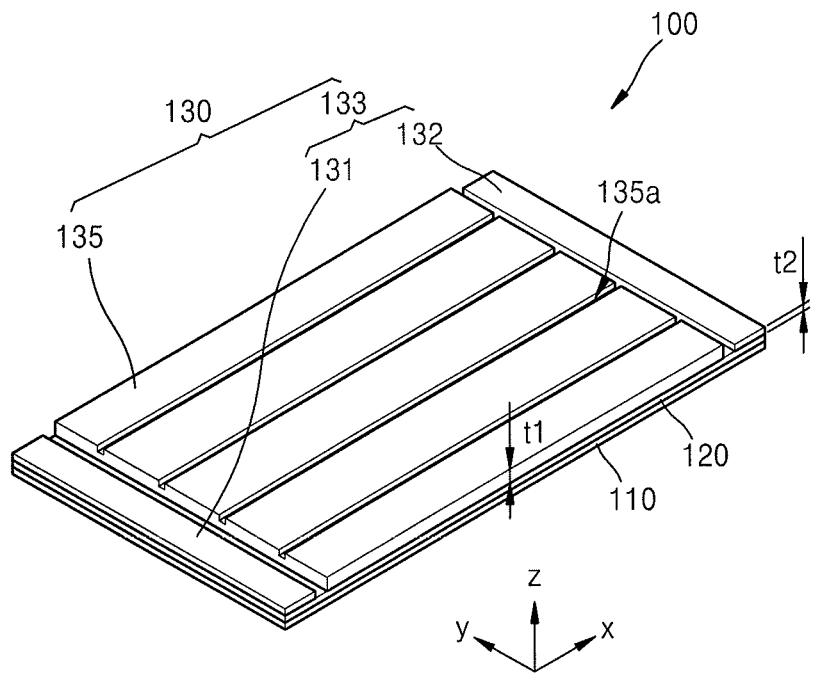
FIG. 8 illustrates a schematic perspective view of a protection tape for a PCB, according to an embodiment.

FIG. 8 illustrates a schematic perspective view of the protection tape 100 for the PCB, according to another embodiment. In the protection tape 100 according to the present embodiment, the main part 135 of the adhesive layer 130 may include a groove 135a extending in a direction between the first subsidiary part 131 and the second subsidiary part 132 in an upper surface (+z direction) of the main part 135. As shown in FIG. 8, the groove 135a may extend from an end of the main part 135 in a direction toward the first subsidiary part 131 to an end of the main part 135 in a direction toward the second subsidiary part 132. The groove 135a may be connected to a space between the main part 135 and the first subsidiary part 131 and to space between the main part 135 and the second subsidiary part 132. When the protection tape 100 is attached to the PCB 300, it is desirable to prevent air, etc. from being trapped between the protection tape 100 and the PCB 300. The groove 135a may act to prevent or reduce the likelihood of air being trapped.

As described above, when the protection tape 100 is attached to the PCB 300, a vicinity of an edge of the protection tape 100 that is a −x axis direction edge extending in a y axis direction, i.e., the first subsidiary part 131 of the adhesive layer 130 and/or a vicinity thereof, may contact a corresponding part of the PCB 300 first, and an area of the adhesive layer 130 that contacts the PCB 300 may gradually increase until a vicinity of an edge of the adhesive layer 130 that is a +x axis direction edge extending in the y axis direction, i.e., the second subsidiary part 132 of the adhesive layer 130, contacts a corresponding part of the PCB 300. Air between the protection tape 100 and the PCB 300 may be discharged to the outside through the groove 135a. Thus, the protection tape 100 according to the present embodiment may effectively prevent air from being trapped between the protection tape 100 and the PCB 300.

The groove 135a may extend in a direction from the first subsidiary part 131 to the second subsidiary part 132. Accordingly, the groove 135a may allow air to naturally move and to be finally discharged outside during a process of attaching the protection tape 100 to the PCB 300 sequentially from the first subsidiary part 131 to the second subsidiary part 132 via the main part 135. The groove 135a may be connected to the space between the main part 135 and the first subsidiary part 131 and to the space between the main part 135 and the second subsidiary part 132 such that the groove 135a and the spaces may act as a path through which air is discharged to the outside.

Various methods may be used to form the groove 135a. For example, a mold having a protrusion corresponding to a shape of the groove 135a may be pressed into the main part 135 having a planar upper surface such that the main part 135a includes the groove 135a in the upper surface. When the protection tape 100 including the groove 135a is attached to the PCB 300, the shape of the adhesive layer 130 having elasticity may become deformed. Accordingly, the groove 135a may be sunken. In this case, when the shape of the main part 135 of the adhesive layer 130 is deformed, the adhesive layer 130 may continuously contact the PCB 300.

A height from an upper surface of the conductive layer 120 (+z direction) to a lower surface of the groove 135a may be greater than the height from the upper surface of the conductive layer 120 to an upper surface of the first subsidiary part 131 or the second subsidiary part 132. Thus, during the process of attaching the protection tape 100 to the PCB 300, the groove 135a may be connected to the space between the main part 135 and the first subsidiary part 131 and the space between the main part 135 and the second subsidiary part 132 such that the groove 135a and the spaces may act as the path through which air is discharged to the outside. If the height from the upper surface of the conductive layer 120 (+z direction) to the lower surface of the groove 135a were to be less than the height from the upper surface of the conductive layer 120 to the upper surface of the first subsidiary part 131 or the second subsidiary part 132, the groove 135a may not be sufficiently deep and may be very shallow. In this case, when the shape of the adhesive layer 130 having elasticity is deformed when the protection tape 100 is attached to the PCB 300, the groove 135a may be sunken before air between the protection tape 100 and the PCB 300 is discharged to the outside through the groove 135a, and thus air may be trapped between the protection tape 100 and the PCB 300.

Figure 9:
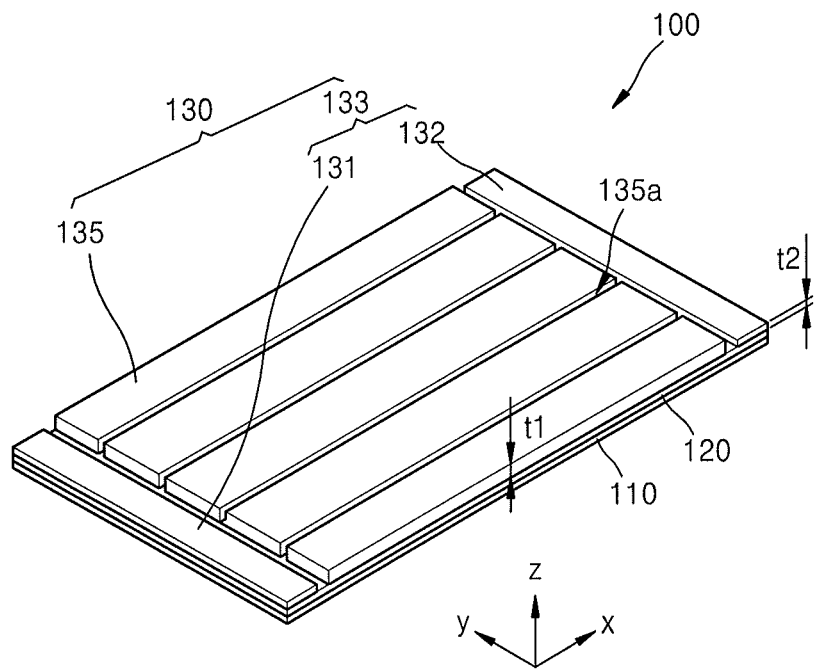
FIG. 9 illustrates a schematic perspective view of a protection tape for a PCB, according to an embodiment.

In FIG. 8, the main part 135 includes the groove 135a. FIG. 9 illustrates a schematic perspective view of the protection tape 100 for the PCB, according to another embodiment. As shown in FIG. 9, groove 135a the main part 135 of the protection tape 100 may be deepened to constitute an the opening 135a extending in a direction from the first subsidiary part 131 to the second subsidiary part 132. A height of the groove 135a of FIG. 8 may be identical to the first thickness t1, which is a thickness of the main part 135.

Figure 10:
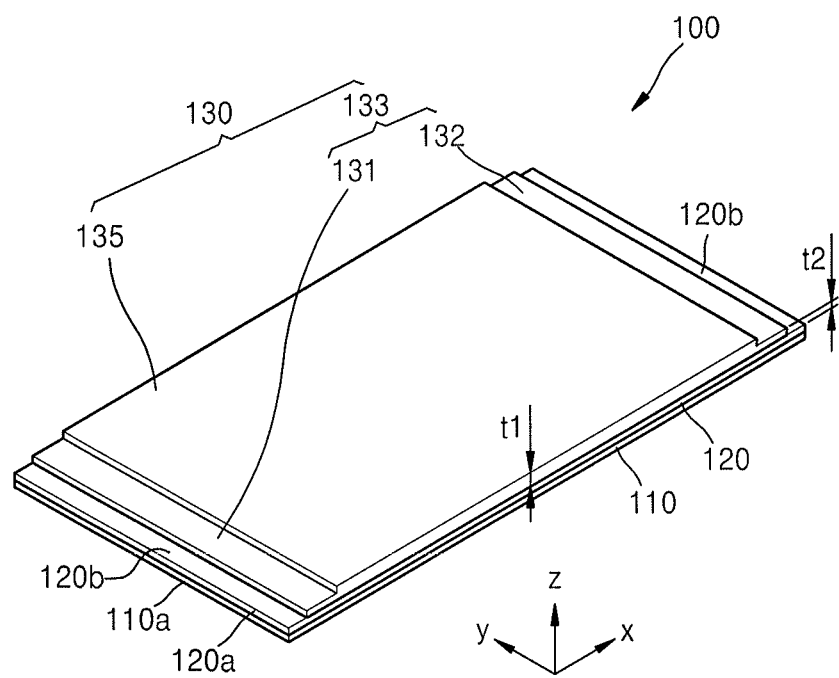
FIG. 10 illustrates a schematic perspective view of a protection tape for a PCB, according to an embodiment.

An edge end surface of the base plate 110, an edge end surface of the conductive layer 120, and an edge end surface of the adhesive layer 130 are shown to be identical to each other in FIG. 1 FIG. 10 illustrates a schematic perspective view of the protection tape 100 for the PCB, according to another embodiment. For example, as shown in FIG. 10, an edge end surface 110a of the base plate 110 and an edge end surface 120a of the conductive layer 120 may be identical to each other, and the subsidiary part 133 may be positioned over the conductive layer 120 to expose an upper surface 120b of the conductive layer 120 around at least one edge. Movement of the first subsidiary part 131 or the second subsidiary part 132 of the adhesive layer 130 to outside the area of the PCB 300 during a process of attaching the protection tape 100 to the PCB 300 may be hindered or prevented.

Figure 11:
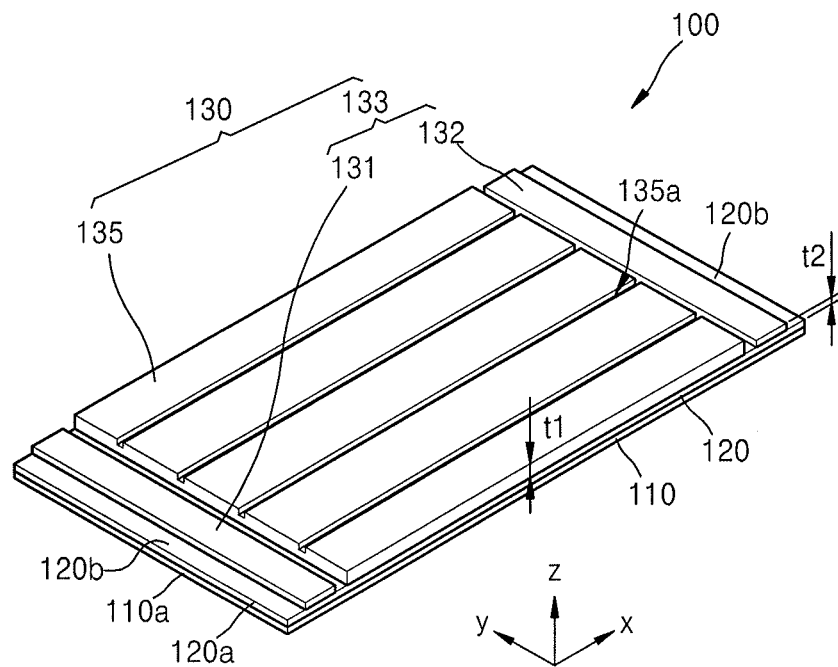
FIG. 11 illustrates a schematic perspective view of a protection tape for a PCB, according to an embodiment.

FIG. 11 illustrates a schematic perspective view of the protection tape 100, according to another embodiment. As shown in FIG. 11, the main part 135 and the subsidiary part 133 of the adhesive layer 130 may also be spaced apart from each other. In addition, the main part 135 may include the groove or opening 135a in an upper surface of the main part 135, as shown in FIGS. 8 and 9.

Figure 12:
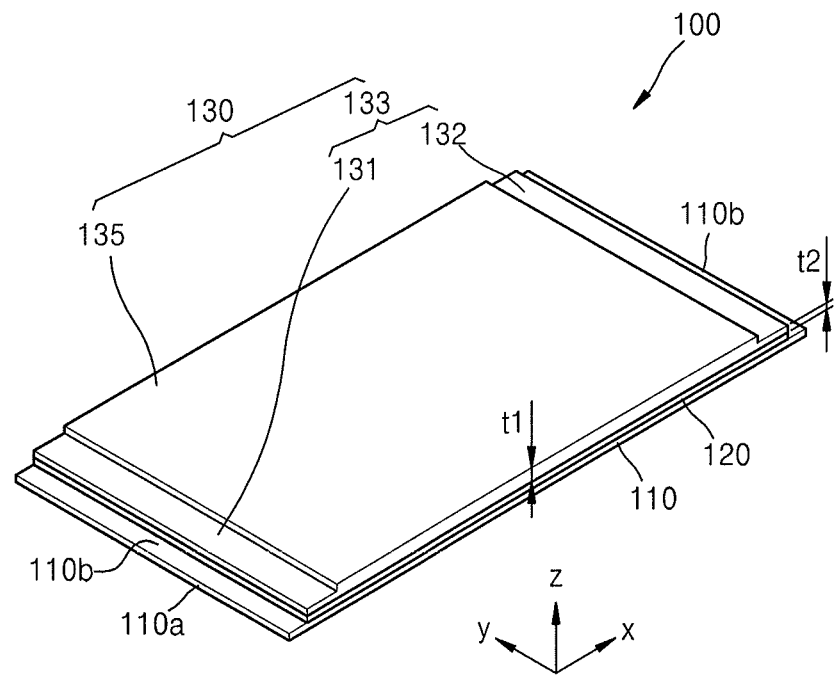
FIG. 12 illustrates a schematic perspective view of a protection tape for a PCB, according to an embodiment.

FIG. 12 illustrates a schematic perspective view of the protection tape 100 according to another embodiment. As shown in FIG. 12, end surfaces of the conductive layer 120 and the adhesive layer 130 may be identical to or coextensive with each other. The conductive layer 120 may be located over the base plate 110 such that the upper surface 110b of the base plate 110 is exposed around at least one edge. In some implementations, the main part 135 and the subsidiary part 133 of the adhesive layer 130 may be spaced apart from each other as shown in FIGS. 5, 8, 9, and 11.

Figure 13:
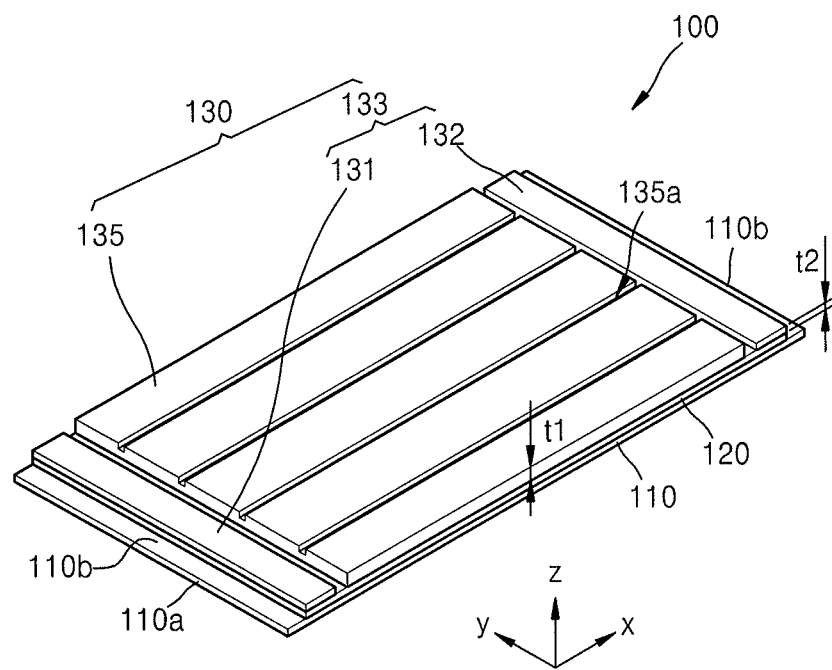
FIG. 13 illustrates a schematic perspective view of a protection tape for a PCB, according to an embodiment.

FIG. 13 illustrates a schematic perspective view of the protection tape 100 for the PCB, according to another embodiment. As shown in FIG. 13, the main part 135 and the subsidiary part 133 of the adhesive layer 130 may be spaced apart from each other, and the main part 135 may include the groove or opening 135a in an upper surface.

Figure 14:
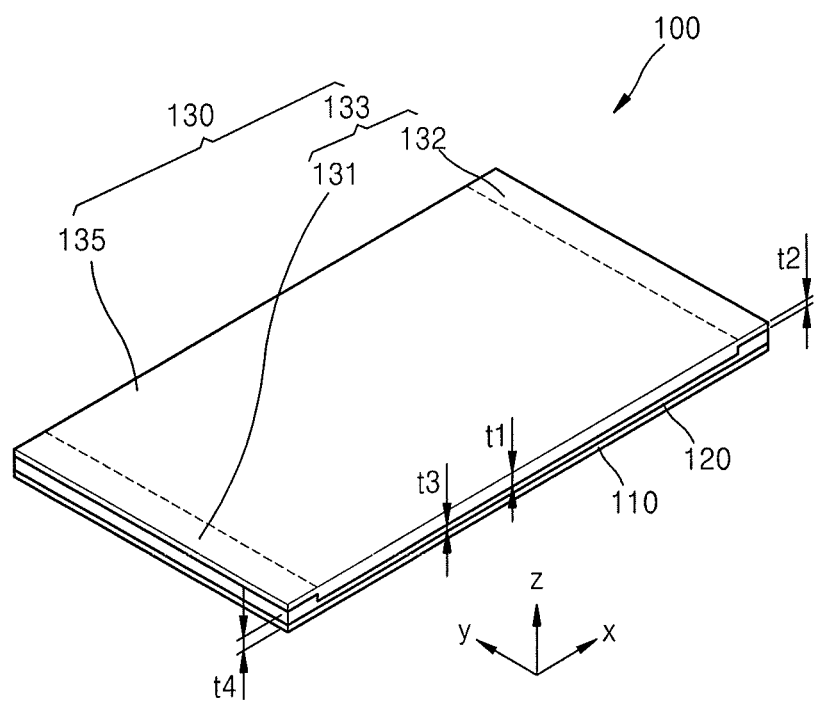
FIG. 14 illustrates a schematic perspective view of a protection tape for a PCB, according to an embodiment.

FIG. 14 illustrates a schematic perspective view of the protection tape 100 for the PCB, according to an embodiment. In the protection tape 100 according to this embodiment, the conductive layer 120 may not have a uniform thickness. For example, the conductive layer 120 may include a center portion corresponding to the main part 135 of the adhesive layer 130 and having a third thickness t3 and an edge part corresponding to the subsidiary part 133 of the adhesive layer 130 and having a fourth thickness t2 greater than the third thickness t3. In this case, when an upper surface of the adhesive layer 130 is planar when the adhesive layer 130 is formed over the conductive layer 120, the subsidiary part 133 may naturally have the second thickness t2 less than the first thickness t1 of the main part 135. In this regard, a distance from an upper surface of the base plate 110 to an upper surface of the main part 135 of the adhesive layer 130 may be understood as being the same as the distance from the upper surface of the base plate 110 to an upper surface of the subsidiary part 133.

Figure 15:
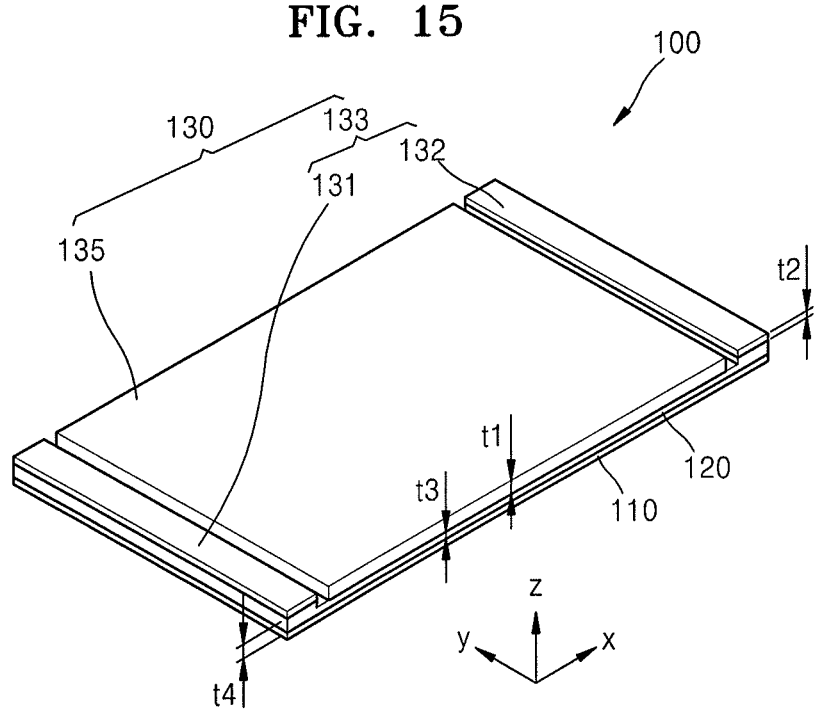
FIG. 15 illustrates a schematic perspective view of a protection tape for a PCB, according to an embodiment.

FIG. 15 illustrates a schematic perspective view of the protection tape 100 for the PCB, according to an embodiment that is further to a structure as shown in FIG. 14. As shown in FIG. 15, the main part 135 and the subsidiary part 133 of the adhesive layer 130 may be spaced apart from each other.

Figure 16:
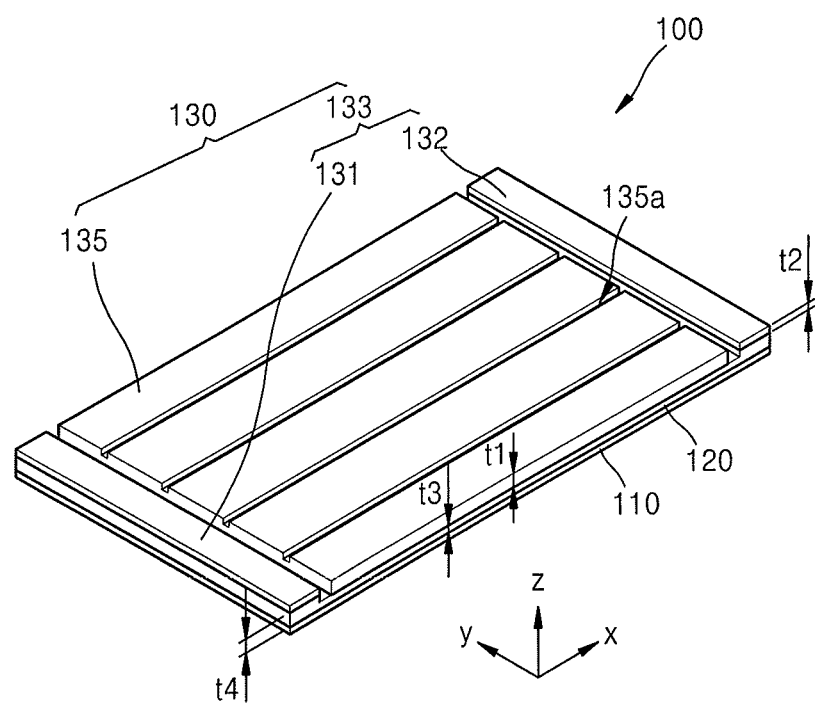
FIG. 16 illustrates a schematic perspective view of a protection tape for a PCB, according to an embodiment.

FIG. 16 illustrates a schematic perspective view of the protection tape 100 for the PCB, according to an embodiment. As shown in FIG. 16, the main part 135 may include the groove or opening 135a in an upper surface (see FIG. 9), etc.

Figure 17:
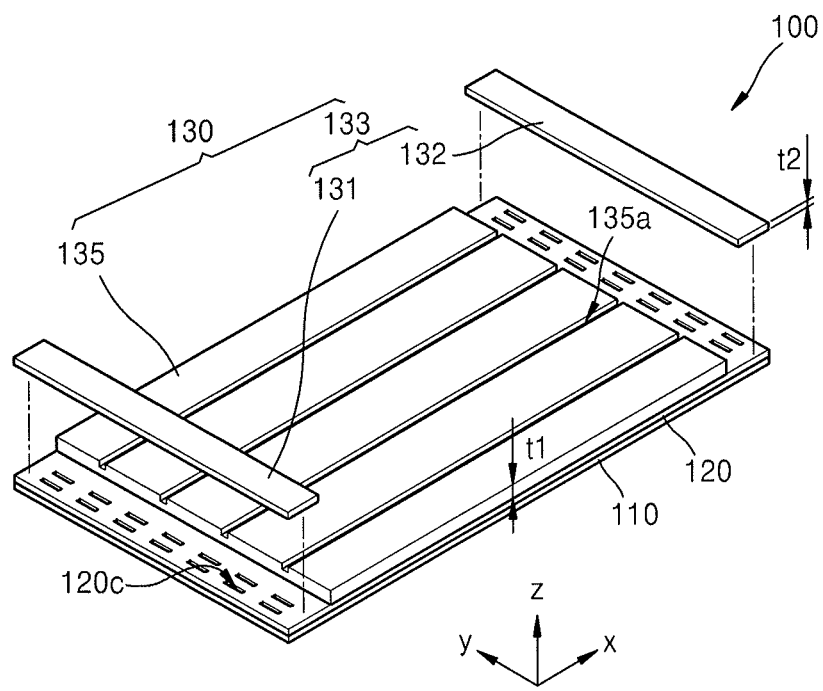
FIG. 17 illustrates a schematic perspective view of a protection tape for a PCB, according to an embodiment.

FIG. 17 illustrates a schematic perspective view of the protection tape 100 for the PCB, according to an embodiment. The conductive layer 120 of the protection tape 100 according to this embodiment may include a plurality of grooves 120c in an upper surface thereof at a location corresponding to the subsidiary part 133 of the adhesive layer 130. Adhesive layer material of the subsidiary part 133 of the adhesive layer 130 may fill the grooves 120c of the conductive layer 120.

When the adhesive layer material of the subsidiary part 133 of the adhesive layer 130 fills the grooves 120c of the conductive layer 120, a bonding force between the subsidiary part 133 and the conductive layer 120 may increase, thereby effectively preventing the subsidiary part 133 of the adhesive layer 130 from moving outside the area of the PCB 300 when the protection tape 100 is attached to the PCB 300. For example, as shown in FIG. 17, each of the grooves 120c of the conductive layer 120 may have a shape extending in a direction (y axis direction) crossing a direction (+x direction) from the first subsidiary part 131 to the second subsidiary part 132, thereby minimizing movement of the subsidiary part 133 of the adhesive layer 130 in the direction (+x direction) from the first subsidiary part 131 to the second subsidiary part 132 or in a direction (−x direction) opposite to the direction (+x direction) when the protection tape 100 is attached to the PCB 300.

In some implementations, the conductive layer 120 may not include the grooves 120c, but an adhesive force of the subsidiary part 133 of the adhesive layer 130 may be greater than the adhesive force of the main part 135, thereby preventing the subsidiary part 133 of the adhesive layer 130 from moving outside the area of the PCB 300 when the protection tape 100 is attached to the PCB 300. Various methods may be used to adjust the adhesive force of the adhesive layer 130. For example, the adhesive force may increase as temperature increases. Accordingly, when the subsidiary part 133 is contacted with the conductive layer 120, a high temperature such as 100° C. may be applied or maintained, and when the main part 135 is contacted with the conductive layer 120, a room temperature may be maintained, thereby adjusting the adhesive force of the different parts of the adhesive layer 130 when the protection tape 100 is attached to the PCB 300.

In some implementations, the adhesive layer 130 may include a material that reacts with ultraviolet rays. Ultraviolet rays may be irradiated onto a specific portion of the adhesive layer 130, and an adhesive force of the portion on which ultraviolet rays are irradiated may be varied. For example, the adhesive force of the main part 135 may be made to be less than the adhesive force of the subsidiary part 133 by irradiating ultraviolet rays onto the main part 135 of the adhesive layer 130. For reference, an adhesive force of a general PSA may be weakened when ultraviolet rays are irradiated.

Figure 18:
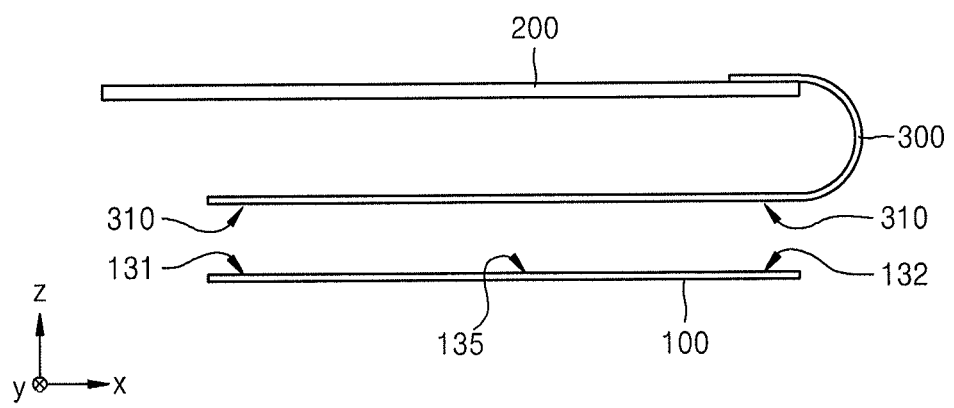
FIG. 18 illustrates a schematic lateral view of a display device, according to an embodiment.

FIG. 18 illustrates a schematic lateral view of a display device, according to another embodiment, In the embodiments of the protection tape 100 described above and modifications thereof, the subsidiary part 133 of the adhesive layer 130 may include a conductive material. In this case, when the adhesive layer 130 is positioned over the conductive layer 120, the subsidiary part 133 of the adhesive layer 130 may be electrically connected to the conductive layer 120. If the PCB 300 includes a ground part 310 over a surface to which the protection tape 100 for the PCB is attached, as shown in FIG. 18, and the ground part 310 contacts the subsidiary part 133 of the adhesive layer 130 included in the protection tape 100, the conductive layer 120 of the protection tape 100 may be electrically connected to the ground part 310 of the PCB 300 through the subsidiary part 133. In this case, the conductive layer 120 of the protection tape 100 may be grounded, and thus the conductive layer 120 may effectively act as a shield layer that protects a wiring or an electronic device, etc. over the PCB 300 from an external electrical signal, etc. As shown in FIG. 18, the PCB 300 may include the ground part 310 in each of ends in −x and +x directions such that each of the first subsidiary part 131 and the second subsidiary part 132 of the adhesive layer 130 of the protection tape 100 contacts the ground part 310 of the PCB 300.

The embodiments described above and modifications thereof may be combined. For example, when the main part 135 and the subsidiary part 133 of the adhesive layer 130 are spaced apart from each other as shown in FIG. 17, the conductive layer 120 may include the grooves 120c in an upper surface of a portion corresponding to the subsidiary part 133, or when the main part 135 and the subsidiary part 133 of the adhesive layer 130 are integrally formed as shown in FIG. 1, the conductive layer 120 may include the grooves 120c in the upper surface of the portion corresponding to the subsidiary part 133.

As described above, according to the embodiments, a protection tape for a PCB capable of preventing a defect from occurring during a manufacturing process or while in use and a display device including the same may be implemented.

By way of summation and review, in a conventional display device there is a risk that wirings formed in a printed circuit board (PCB) may contact other electronic devices and/or a frame, etc. during a manufacturing process or while in use after the display device is completely manufactured. Such contact could cause the conductive wirings formed in the PCB to be electrically connected to other electronic devices unexpectedly or could cause a short circuit between the conductive wirings formed in the PCB due to other electronic device or a frame, etc.

One or more embodiments include a protection tape for a PCB capable of preventing a defect from occurring during a manufacturing process or use of a display device. One or more embodiments are directed to a display device including the protection tape.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A protection tape for a printed circuit board (PCB), the protection tape comprising:
an insulating base plate;
a conductive layer covering an entire surface of the insulating base plate, the conductive layer being continuous over the entire surface of the insulating base plate; and
an adhesive layer over the conductive layer, the adhesive layer including a main part having a first thickness and a subsidiary part having a second thickness less than the first thickness, the main part corresponding to at least a center portion of the insulating base plate and the subsidiary part being arranged at an outside of the main part, wherein:
a thickness of the protection tape at a location corresponding to the main part is greater than a thickness of the protection tape at a location corresponding to the subsidiary part,
when viewed in cross-section, an entirety of each of the main part and the subsidiary part extends in a same direction, and
the subsidiary part includes a first subsidiary part positioned at one side of the main part and a second subsidiary part positioned at another side of the main part, the first subsidiary part and the second subsidiary part being spaced apart from the main part,
and wherein:
the main part includes a groove in an upper surface of the main part, the groove extending in a direction between the second subsidiary part and the first subsidiary part, or
the main part includes an opening in the upper surface of the main part, the opening extending in the direction between the second subsidiary part and the first subsidiary part in an upper surface of the main part.

2. The protection tape for a PCB as claimed in claim 1, wherein the subsidiary part is positioned outside the main part and surrounds the main part.

3. The protection tape for a PCB as claimed in claim 1, wherein the first subsidiary part and the second subsidiary part of the adhesive layer are located adjacent to opposite ends of the main part of the adhesive layer such that when the adhesive layer is pressed to the PCB in an attachment direction from the first subsidiary part toward the second subsidiary part, adhesive layer material of the adhesive layer that is pressed in the direction of the second subsidiary part is prevented by the second subsidiary part from extending to an outside of the protection tape.

4. The protection tape for a PCB as claimed in claim 1, wherein the groove or opening extends from an end of the main part next to the first subsidiary part to an end of the main part next to the second subsidiary part.

5. A protection tape for a printed circuit board (PCB), the protection tape comprising:
   an insulating base plate;
   a conductive layer covering an entire surface of the insulating base plate, the conductive layer being continuous over the entire surface of the insulating base plate; and
   an adhesive layer over the conductive layer, the adhesive layer including a main part having a first thickness and a subsidiary part having a second thickness less than the first thickness, the main part corresponding to at least a center portion of the insulating base plate and the subsidiary part being arranged at an outside of the main part, wherein:
   a thickness of the protection tape at a location corresponding to the main part is greater than a thickness of the protection tape at a location corresponding to the subsidiary part, and
   when viewed in cross-section, an entirety of each of the main part and the subsidiary part extends in a same direction,
   the subsidiary part includes a first subsidiary part positioned at one side of the main part and a second subsidiary part positioned at another side of the main part, the first subsidiary part and the second subsidiary part being spaced apart from the main part,
   the main part includes a groove extending in a direction from the first subsidiary part to the second subsidiary part in an upper surface of the main part, and
   a height from an upper surface of the conductive layer in a direction toward the adhesive layer to a lower surface in the groove is greater than a height from the upper surface of the conductive layer to an upper surface of the first subsidiary part.

6. The protection tape for a PCB as claimed in claim 3, wherein the main part of the adhesive layer includes a plurality of grooves extending from an end of the main part adjacent to the first subsidiary part to an opposite end of the main part adjacent to the second subsidiary part, the grooves being configured such that when the adhesive layer is pressed to the PCB in an attachment direction from the first subsidiary part toward the second subsidiary part, air that is present between the protection tape and the PCB is discharged to an outside through the grooves and through a space between the main part and the second subsidiary part.

7. The protection tape for a PCB as claimed in claim 1, wherein:
   an edge end surface of the insulating base plate is flush with an edge end surface of the conductive layer, and
   the subsidiary part is located over the conductive layer such that an upper surface of the conductive layer around at least one edge of the conductive layer is exposed.

8. A protection tape for a printed circuit board (PCB), the protection tape comprising:
   an insulating base plate;
   a conductive layer over the insulating base plate; and
   an adhesive layer over the conductive layer, the adhesive layer including a main part having a first thickness and a subsidiary part having a second thickness less than the first thickness, the main part corresponding to at least a center portion of the insulating base plate and the subsidiary part being arranged at an outside of the main part,
   wherein the conductive layer includes a center part having a third thickness, and an edge part having a fourth thickness greater than the third thickness, the center part of the conductive layer corresponding to the main part of the adhesive layer and the edge part corresponding to the subsidiary part of the adhesive layer.

9. The protection tape for a PCB as claimed in claim 8, wherein a distance from an upper surface of the insulating base plate to an upper surface of the main part of the adhesive layer is the same as a distance from the upper surface of the insulating base plate to an upper surface of the subsidiary part of the adhesive layer.

10. A protection tape for a printed circuit board (PCB), the protection tape comprising:
    an insulating base plate;
    a conductive layer over the insulating base plate; and
    an adhesive layer over the conductive layer, the adhesive layer including a main part having a first thickness and a subsidiary part having a second thickness less than the first thickness, the main part corresponding to at least a center portion of the insulating base plate and the subsidiary part being arranged at an outside of the main part, wherein:
    an upper surface of a portion of the conductive layer corresponding to the subsidiary part includes a plurality of grooves, and
    the subsidiary part fills the plurality of grooves.

11. The protection tape for the PCB as claimed in claim 1, wherein the main part and the subsidiary part are spaced apart from each other.

12. The protection tape for the PCB as claimed in claim 1, wherein the subsidiary part includes a conductive material.

13. The protection tape for the PCB as claimed in claim 1, wherein a hardness of the subsidiary part is greater than a hardness of the main part.

14. The protection tape for the PCB as claimed in claim 1, wherein:
    each of the main part and the subsidiary part includes oligomers and monomers, and
    a ratio of the monomers to oligomers in the subsidiary part is higher than a ratio of the monomers to oligomers in the main part.

15. A display device, comprising:
    a display panel including an upper surface and a lower surface;
    a printed circuit board (PCB) electrically connected to the display panel; and
    the protection tape for the PCB as claimed in claim 1 covering one surface of the PCB, the PCB including an upper surface and a lower surface, and wherein the display panel or the PCB is bent such that the lower surface of the display panel and the lower surface of the PCB face each other, and the protection tape for the PCB covers the upper surface of the PCB.

16. The display device as claimed in claim 15, wherein the main part and the subsidiary part of the adhesive layer are spaced apart from each other.

17. The display device as claimed in claim 15, wherein:
    the subsidiary part of the adhesive layer includes a conductive material, and
    the PCB comprises a ground part electrically connected to the subsidiary part.

18. The display device as claimed in claim 15, wherein a hardness of the subsidiary part is greater than a hardness of the main part.

19. The display device as claimed in claim 15, wherein:
   each of a main part and a subsidiary part of the adhesive layer includes oligomers and monomers, and
   a ratio of the monomers to oligomers in the subsidiary part is higher than a ratio of the monomers to oligomers in the main part.

20. The display device as claimed in claim 15, wherein the adhesive layer does not extend beyond a boundary of the PCB.

21. The display device as claimed in claim 15, wherein the display device further includes at least one electronic device attached to an opposite surface of the protection tape from the PCB.

22. The display device as claimed in claim 21, wherein the at least one electronic device includes a battery or a camera.

* * * * *